United States Patent
Gorman et al.

(10) Patent No.: US 9,773,570 B2
(45) Date of Patent: Sep. 26, 2017

(54) BUILT-IN-SELF-TEST (BIST) TEST TIME REDUCTION

(71) Applicant: International Business Machines Corporation, Armonk, NY (US)

(72) Inventors: Kevin W. Gorman, Fairfax, VT (US); Deepak I. Hanagandi, Karnataka (IN); Krishnendu Mondal, Bangalore (IN); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 598 days.

(21) Appl. No.: 13/786,572

(22) Filed: Mar. 6, 2013

(65) Prior Publication Data

US 2014/0258797 A1    Sep. 11, 2014

(51) Int. Cl.
*G11C 29/40* (2006.01)
*G01R 31/317* (2006.01)
*G01R 31/3185* (2006.01)

(52) U.S. Cl.
CPC ........ *G11C 29/40* (2013.01); *G01R 31/31703* (2013.01); *G01R 31/318547* (2013.01)

(58) Field of Classification Search
CPC .............. G11C 29/40; G01R 31/31703; G01R 31/318547; G01R 31/31813; G01R 31/318371
USPC ....... 714/719, 726, E11.155; 702/190; 716/1
See application file for complete search history.

(56) References Cited

U.S. PATENT DOCUMENTS

| | | | |
|---|---|---|---|
| 5,627,995 A * | 5/1997 | Miller et al. | 711/171 |
| 6,374,370 B1 * | 4/2002 | Bockhaus et al. | 714/39 |
| 6,523,135 B1 * | 2/2003 | Nakamura | 714/30 |
| 6,934,205 B1 | 8/2005 | Pandey et al. | |
| 7,206,979 B1 | 4/2007 | Zarrinch et al. | |
| 7,213,186 B2 | 5/2007 | Chien | |
| 7,603,603 B2 * | 10/2009 | Dubey | 714/738 |

(Continued)

FOREIGN PATENT DOCUMENTS

| | | |
|---|---|---|
| JP | 2009026372 A | 2/2009 |
| WO | 02086907 A1 | 10/2002 |
| WO | 2010132712 A1 | 11/2010 |

OTHER PUBLICATIONS

Anonymous; "Testing memories through functional interface using BIST—A breakthrough technique with 100% test quality and 0% timing impact!"; Aug. 3, 2009; IP.com No. IPCOM000185974D, 5 pages.

(Continued)

*Primary Examiner* — Albert Decady
*Assistant Examiner* — Kyle Vallecillo
(74) *Attorney, Agent, or Firm* — Jennifer M. Anda; Hoffman Warnick LLC (57) ABSTRACT

Aspects of the invention provide for reducing BIST test time for a memory of an IC chip. In one embodiment, a BIST architecture for reducing BIST test time of a memory for an integrated circuit (IC) chip, the architecture comprising: a pair of latches for receiving bursts of data from a memory; a first compression stage for receiving a burst of data and compressing the burst of data into a plurality of latches; a second compression stage for comparing the compressed bursts of data with expected data; and a logic gate for determining whether there is a fail in the burst of data.

9 Claims, 6 Drawing Sheets

(56) References Cited

U.S. PATENT DOCUMENTS

| | | |
|---|---|---|
| 2003/0200495 A1 | 10/2003 | Kohno |
| 2004/0109370 A1 | 6/2004 | Gappisch et al. |
| 2006/0146622 A1 | 7/2006 | Mukherjee et al. |
| 2006/0200720 A1* | 9/2006 | Grimme et al. .............. 714/738 |
| 2006/0236186 A1* | 10/2006 | Wang et al. .................. 714/738 |
| 2006/0248414 A1 | 11/2006 | Dubey |
| 2008/0294953 A1* | 11/2008 | Cheng et al. ................. 714/726 |
| 2009/0083594 A1 | 3/2009 | Chelstrom et al. |
| 2009/0254786 A1* | 10/2009 | Cheng et al. ................. 714/729 |
| 2011/0307750 A1* | 12/2011 | Narayanan et al. .......... 714/729 |
| 2013/0066581 A1* | 3/2013 | Ong .............................. 702/120 |

OTHER PUBLICATIONS

Anonymous; "Fast Memory Array testing method for integrated circuit" May 13, 2011; IP.com No. IPCOM000206933D, 5 pages.

* cited by examiner

BUILT-IN-SELF-TEST (BIST) TEST TIME REDUCTION

FIELD OF THE INVENTION

The subject matter disclosed herein relates generally to integrated circuits. More specifically, the disclosure provided herein relates to a method and architecture for reducing the test time of a built-in-self-test (BIST) for a memory of an integrated circuit (IC) chip.

BACKGROUND OF THE INVENTION

Modern day digital signal processors, microprocessors, and network chips process lots of information and store the processed data into memory. Memory typically occupies almost half of the chip area. With decreasing technology nodes, more and more memory cells are closely packed together, thereby increasing the frequency and number of memory faults being detected. Each new technology gives rise to new fault models which require new sets of patterns to test the different kinds of faults in the memories. These new sets of patterns which may be added on top of legacy patterns from older technologies, require more test time, thereby increasing the test cost and the cost of the chip.

A conventional BIST architecture tests the memory at-speed by sending out a "burst" of instructions at a time. The burst may include, for example, four (4) instructions. The number of instructions is chosen to minimize the area and physical design turnaround time. The BIST engine operates using a slow clock, and generates the burst of instructions and then sends the burst of instructions to the memory interface block. The memory interface block then applies the burst of instructions to the memory using a high speed (or fast) clock. While the current instructions are being executed by the memory and the result of any read operation is being compared with the expected data in the memory interface logic, the BIST engine generates the next set of instructions for the next burst.

While performing a write sweep on the full address space of the memory, the BIST writes to a different address location for each instruction of every burst operation. For example, the BIST may write to 4 different address locations in 4 instructions of every burst. But during reading of the memory, data from only 1 out of every 4 of the set of instructions in each burst is read and compared with the expect data. This is because it is desirable to compare the read data in the low speed domain, not the high speed domain.

One reason a high speed comparison is undesirable is because a high speed comparison becomes prohibitive from an area perspective (e.g., the comparator circuitry gets bigger, the logic for assigning redundant elements to make repairs gets more complicated/larger, and at-speed diagnostics requires a cycle counter and two pass testing to stop on the correct cycle). However, to perform the comparison at a low speed, the test circuitry would need to capture the data in the high speed domain and hold it until the burst completes. It would be preferable to capture data from multiple cycles, but this would normally mean multiple capture registers, which is again prohibitive from an area perspective. This leads to the current architectural limitation of only capture data from one read instruction per burst being available.

BRIEF DESCRIPTION OF THE INVENTION

Aspects of the invention provide for reducing BIST test time for a memory of an IC chip. In one embodiment, a BIST architecture for reducing BIST test time of a memory for an integrated circuit (IC) chip, the architecture comprising: a pair of latches for receiving bursts of data from a memory; a first compression stage for receiving a burst of data and compressing the burst of data into a plurality of latches; a second compression stage for comparing the compressed bursts of data with expected data; and a logic gate for determining whether there is a fail in the burst of data.

A first aspect of the invention provides a built-in-self-test (BIST) architecture for reducing BIST test time of a memory for an integrated circuit (IC) chip, the architecture comprising: a pair of latches for receiving bursts of data from a memory; a first compression stage for receiving a burst of data and compressing the burst of data into a plurality of latches; a second compression stage for comparing the compressed bursts of data with expected data; and a logic gate for determining whether there is a fail in the burst of data.

A second aspect of the invention provides a method of reducing test time for a built-in-self-test (BIST) architecture, the method comprising: performing a fast read of the BIST, wherein the performing includes: receiving a burst of data from memory at a pair of latches; compressing the burst of data in a first compression stage; and comparing the compressed burst of data with expected data; determining whether there is fail in the burst of data; and in response to a fail in the burst of data, performing a slow read of the BIST for the failed burst of data.

A third aspect of the invention provides a design structure tangibly embodied in a machine readable medium for designing, manufacturing, or testing a memory of an integrated circuit by performing a built-in-self-test (BIST), the design structure comprising: a pair of latches for receiving bursts of data from a memory; a first compression stage for receiving a burst of data and compressing the burst of data into a plurality of latches; a second compression stage for comparing the compressed bursts of data with expected data; and a logic gate for determining whether there is a fail in the burst of data.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The subject matter disclosed herein relates generally to integrated circuits. More specifically, the disclosure provided herein relates to a method and architecture for reducing the test time of a built-in-self-test (BIST) for a memory of an integrated circuit (IC) chip.

Modern day digital signal processors, microprocessors, and network chips process lots of information and store the processed data into memory. Memory typically occupies almost half of the chip area. With decreasing technology nodes, more and more memory cells are closely packed together, thereby increasing the frequency and number of memory faults being detected. Each new technology gives rise to new fault models which require new sets of patterns to test the different kinds of faults in the memories. New patterns on top of legacy patterns from older technologies require more test time, thereby increasing the test cost and the cost of the chip.

A conventional BIST architecture tests the memory at-speed by sending out a burst of instructions at a time. The burst may include, for example, four (4) instructions. The number of instructions is chosen to minimize the area and physical design turnaround time. The BIST engine operates using a slow clock, and generates the burst of instructions and then sends the burst of instructions to the memory interface block. The memory interface block then applies the burst of instructions to the memory using a high speed (or fast) clock. While the current instructions are being executed by the memory and the result of any read operation is being compared with the expected data in the memory interface logic, the BIST engine generates the next set of instructions for the next burst.

While performing a write sweep on the full address space of the memory, the BIST writes to a different address location for each instruction of every burst operation. For example, the BIST may write to 4 different address locations in 4 instructions of every burst. But during reading of the memory, read data from only 1 out of every 4 of the set of instructions in each burst is captured, to be later compared with the expect data. This is because it is desirable to compare the read data in between bursts, in the low speed domain, not the high speed domain.

One reason a high speed comparison is undesirable is because a high speed comparison becomes prohibitive from an area perspective (e.g., the comparator circuitry gets bigger, the logic for assigning redundant elements to make repairs gets more complicated/larger, and at-speed diagnostics requires a cycle counter and two pass testing to stop on the correct cycle). However, to perform the comparison at a low speed, the test circuitry would need to capture the data in the high speed domain and hold it until the burst completes. It would be preferable to capture data from multiple cycles, but this would normally mean multiple capture registers, which is again prohibitive from an area perspective. This leads to the current architectural limitation of only capture data from one read-capture instruction per burst.

Aspects of the invention provide for reducing BIST test time for a memory of an IC chip. In one embodiment, a BIST architecture for reducing BIST test time of a memory for an integrated circuit (IC) chip, the architecture comprising: a pair of latches for receiving bursts of data from a memory; a first compression stage for receiving a burst of data and compressing the burst of data into a plurality of latches; a second compression stage for comparing the compressed bursts of data with expected data; and a logic gate for determining whether there is a fail in the burst of data.

Figure 1:
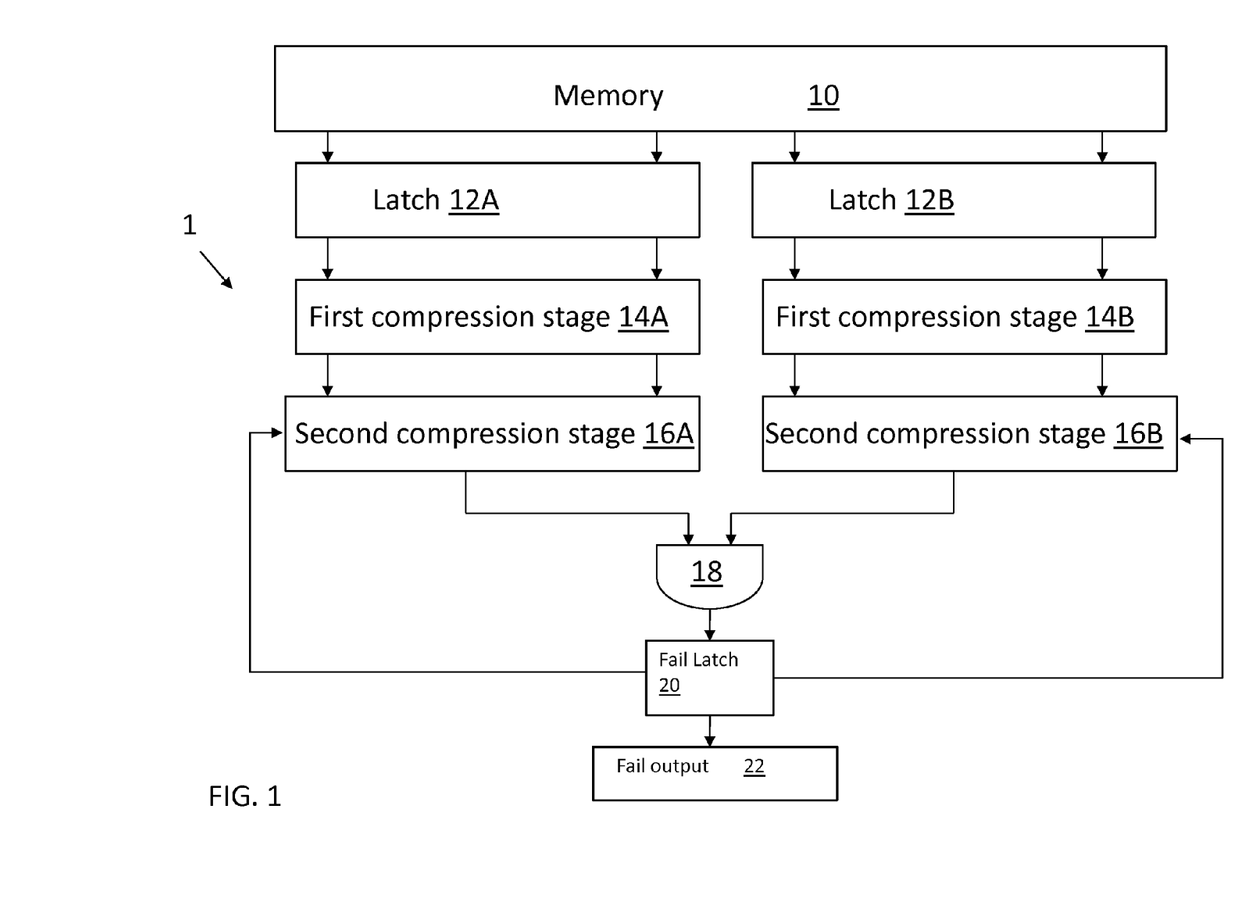
FIG. 1 shows a block diagram of a BIST architecture according to embodiments of the invention.

Turning now to FIG. 1, a block diagram of a BIST architecture 1 for reducing BIST test time of a memory 10 for an IC chip according to embodiments of the invention is shown. The BIST architecture 1 includes a pair of latches 12A, and 12B for receiving bursts of data from memory 10. The bursts of data are compressed using a set of first compression stages 14A and 14B and a set of second compression stages 16A and 16B.

Figure 2:
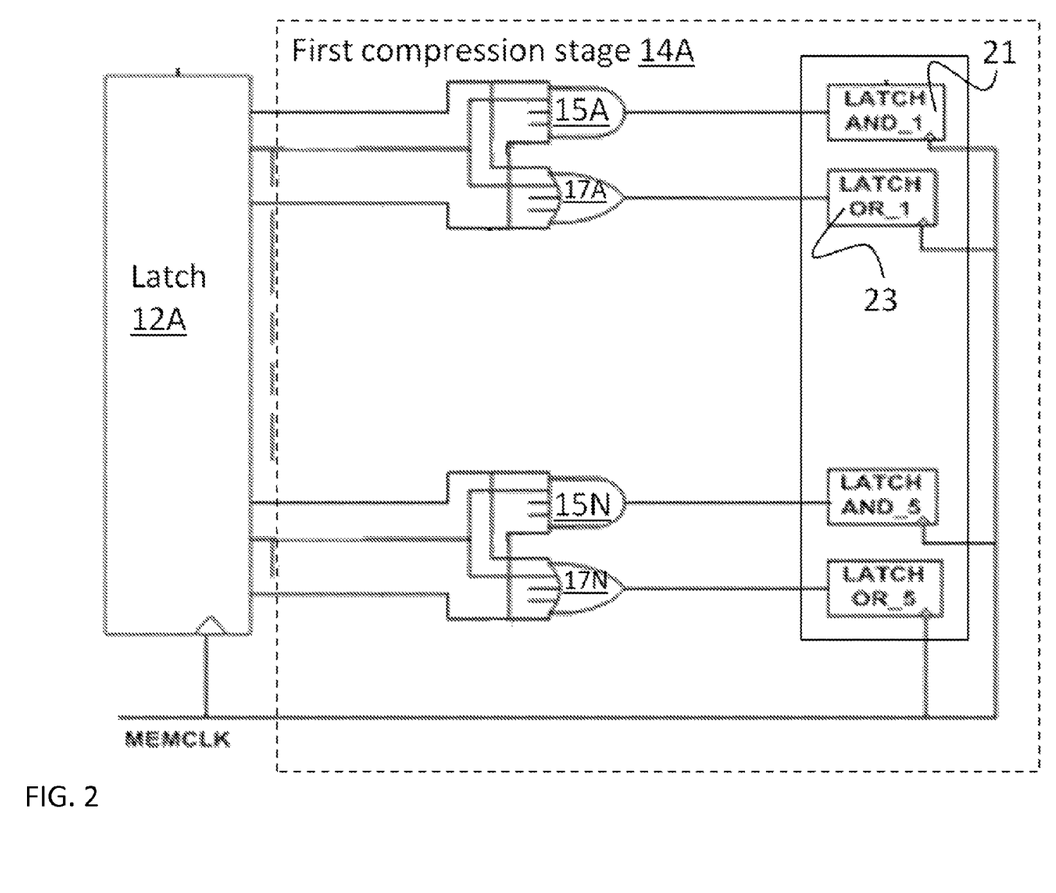
FIG. 2 shows a block diagram of the first compression stage according to embodiments of the invention.

The first compression stages 14A and 14B, receive the burst of data from latches 12A and 12B. In the embodiment shown in FIG. 2, for each 16 bits of data, there is an "AND" gate 15A and an "OR" gate 17A. There may be, for example, 72 bits of data all together, so there would be a total of four (4) 16-bit AND gates 15A and four (4) 16-bit OR gates 17A, and then an 8-bit AND gate 15N and an 8-bit OR gate 17N. Each group, e.g., 16-bits, of data is compressed into a single signal and held by a corresponding latch 21, and/or 23. For example, the output of AND gate 15A is held by AND latch 21, while the output of OR gate 17A is held by OR latch 23. Although FIG. 2 is only shown in reference to first compression stage 14A, it is understood that first compression stage 14B may be identical to first compression stage 14A.

Figure 3:
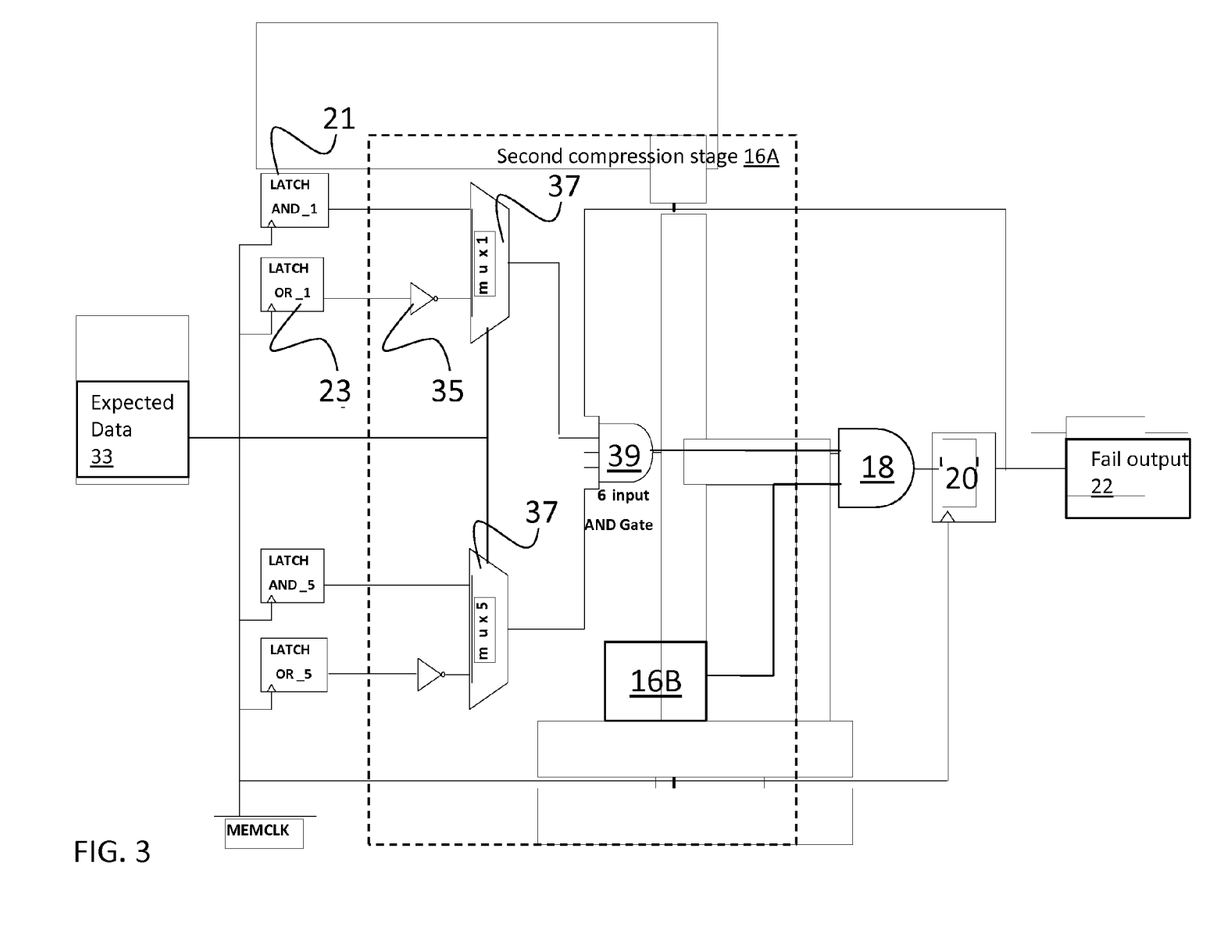
FIG. 3 shows a block diagram of the second compression stage according to embodiments of the invention.

Turning now to FIG. 3, a block diagram of the second compression stage 16A according to embodiments of the invention is shown. The second compression stage 16A compares the compressed bursts of data from latches 21 and 23 with expected data 33. The comparison is performed via a plurality of multiplexors 37. The expected data 33 is used as the selection signal for each of the multiplexors 37.

In operation, if the data from memory 10 is a logic high "1", the output of AND latch 21 should be a logic high "1" as well. However, if there is a fail, the output of AND latch 21 will be a logic low "0." Alternatively, if the data from memory 10 is a logic low "0", the output of OR latch 23 should be a logic low "0" as well. However, if there is a fail, the output of OR latch 23 will be a logic high "1."

As mentioned above, the expected data 33 is used as the selection signal for each of the multiplexors 37. Therefore, if the expected data 33 is a logic high "1," the output of AND latch 21 will be passed by multiplexor 37. Conversely, if the expected data 33 is a logic low "0," the inverted output of OR latch 23, (e.g., inverted by inverter 35), will be passed by multiplexor 37. Under a normal BIST operation, multiplexor 37 should always pass a logic high "1" for either case, since the output of OR latch 23 is inverted. Therefore, if multiplexor 37 ever passes a logic low "0," there is a fail.

For each pair of AND and OR latches 21 and 23, there is a multiplexor 37. The outputs of the multiplexors 37 are ANDed using AND gate 39. If there is a normal BIST operation, and no fail, the output of AND gate 39 is a logic high "1." However, if there is a fail in the burst of data, the output of AND gate 39 is a logic low "0."

The BIST architecture 1 also includes a logic gate 18 (e.g., an AND gate) for determining whether there is a fail in the burst of data. If the output of an AND gate 39 of either second compression stage 16A or 16B is a logic low "0", a fail latch 20 will hold that value, and feed it back to the AND gate 39. Therefore, for all instructions (e.g., the four instructions) in the burst, even if there is only a fail in the first instruction, the fail latch 20 will continue to hold the logic low "0" value as the fail output 22.

Figure 4:
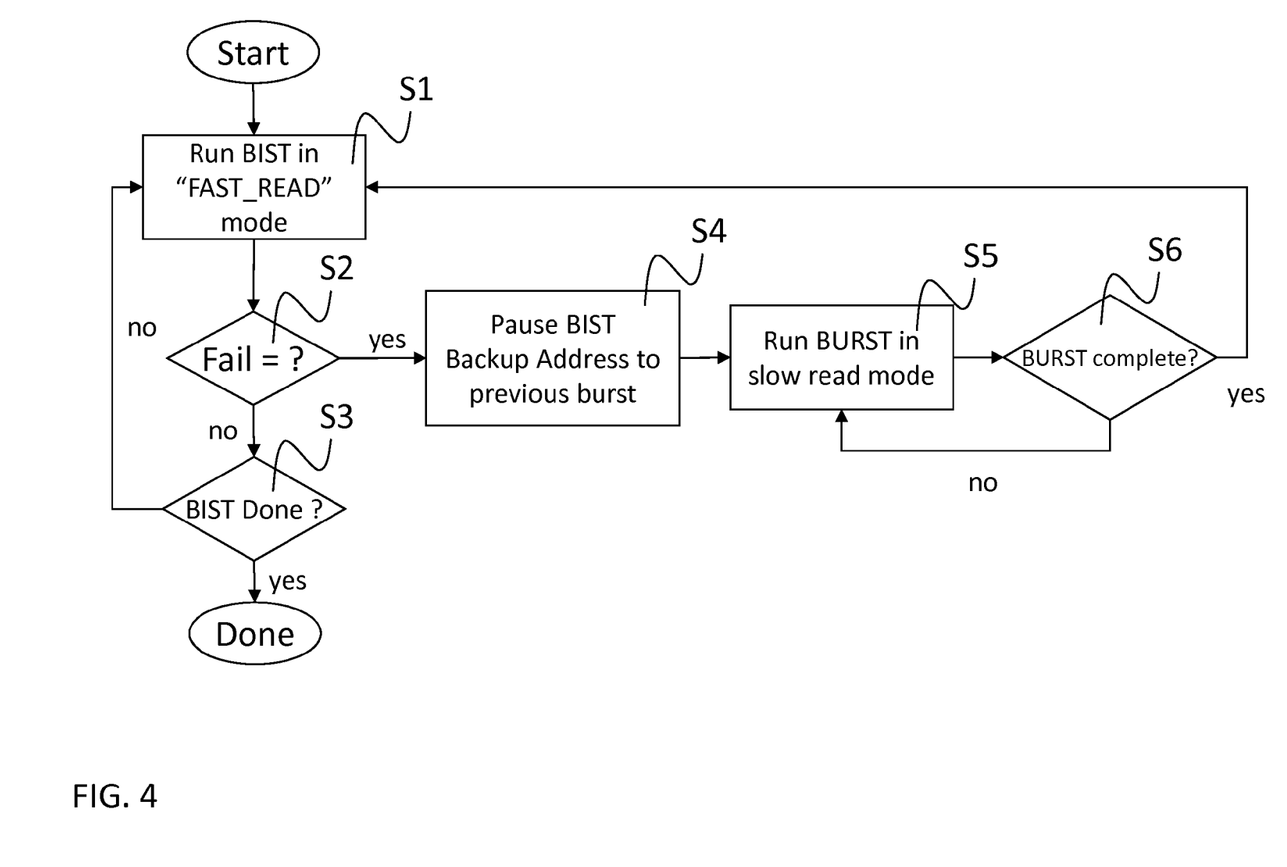
FIG. 4 shows a flow diagram of a method according to embodiments of the invention.

Turning now to FIG. 4, and with continuing reference to FIGS. 1-3, a flow diagram of a method according to embodiments of the invention is shown. In S1, the BIST architecture 1 is run in a fast mode. That is, during operation of a BIST read sweep (BIST patterns that perform four reads of four different addresses during each burst in order to read all addresses in the memory), a BIST engine (not shown) will generate a different address for each instruction in the burst during the read sweep BIST pattern. The read data from all instructions of the burst are compressed into a signature string. The burst of data is compressed using first compression stage 14A, as shown in FIG. 2. The signature string is then compared with the expected signature string (i.e., expected data 33) to determine whether there is a fail in the burst (S2). In this way, the fail is determined for the entire burst of data and there is no determination on which read instruction within the burst actually failed. If there are no fails in the burst, and if the BIST is done (yes at S3), then the test is finished. If there are no fails in the burst, but if the BIST is not complete (no at S3), then test will resume in fast mode for the next burst of instructions.

As mentioned above, if there is a fail (yes at S2), the fail is for the entire burst of data, without any knowledge of which instruction within the burst actually failed. At S4, the BIST is paused and the BIST resumes for only a read and compare of one of the four instructions of the failed burst of data, by setting a burst address of the BIST to a previous burst address. The failing burst is then run four times, where during each time, one of the read instructions is set to be captured and then compared to the expect data. Alternatively stated, during a slow read of the failed burst, each instruction is read, captured and compared individually to expect data, to determine which instruction within the burst of instructions actually failed. Once the entire set of the instructions for the failing burst in a slow mode BIST is complete (yes at S6), the BIST is resumed in fast read mode, starting at the next burst following the failing burst. This will help to significantly reduce the test time, since the vast majority of bursts do not contain fails, and hence the majority of bursts will all be run in fast read mode only.

The method shown in FIG. 4 works efficiently to reduce BIST test time for simple read-only BIST patterns. For example, the method in FIG. 4 works well with patterns that include instructions within a burst that only performs read operations, usually from different addresses. However, if a burst of instructions includes a pattern that reads and writes to a single address, multiple times, then reverting to a previous burst address and simply re-running the burst in slow-mode four separate times, as described, may not effectively determine which instruction in the burst of data has failed. For example, a burst of instructions may contain four separate instructions that perform, respectively, a read of "initial data" from address "X," followed by a write of "inverse data" to address "X," followed by a read of "inverse data" from address "X," and lastly followed by a write of "inverse data" to address "X." In this case, address "X" ends with a data state (inverse data) that is opposite of the starting data state (initial data). As such, simply re-running the burst (e.g., in the event the burst fails) in slow read and compare mode is not practicable, since the content of address "X" is now "inverse data" and is no longer in the desired starting state of "initial data." As such, it may not be possible to simply re-perform the burst, since the content of address "X" is not in the correct start state.

Figure 5:
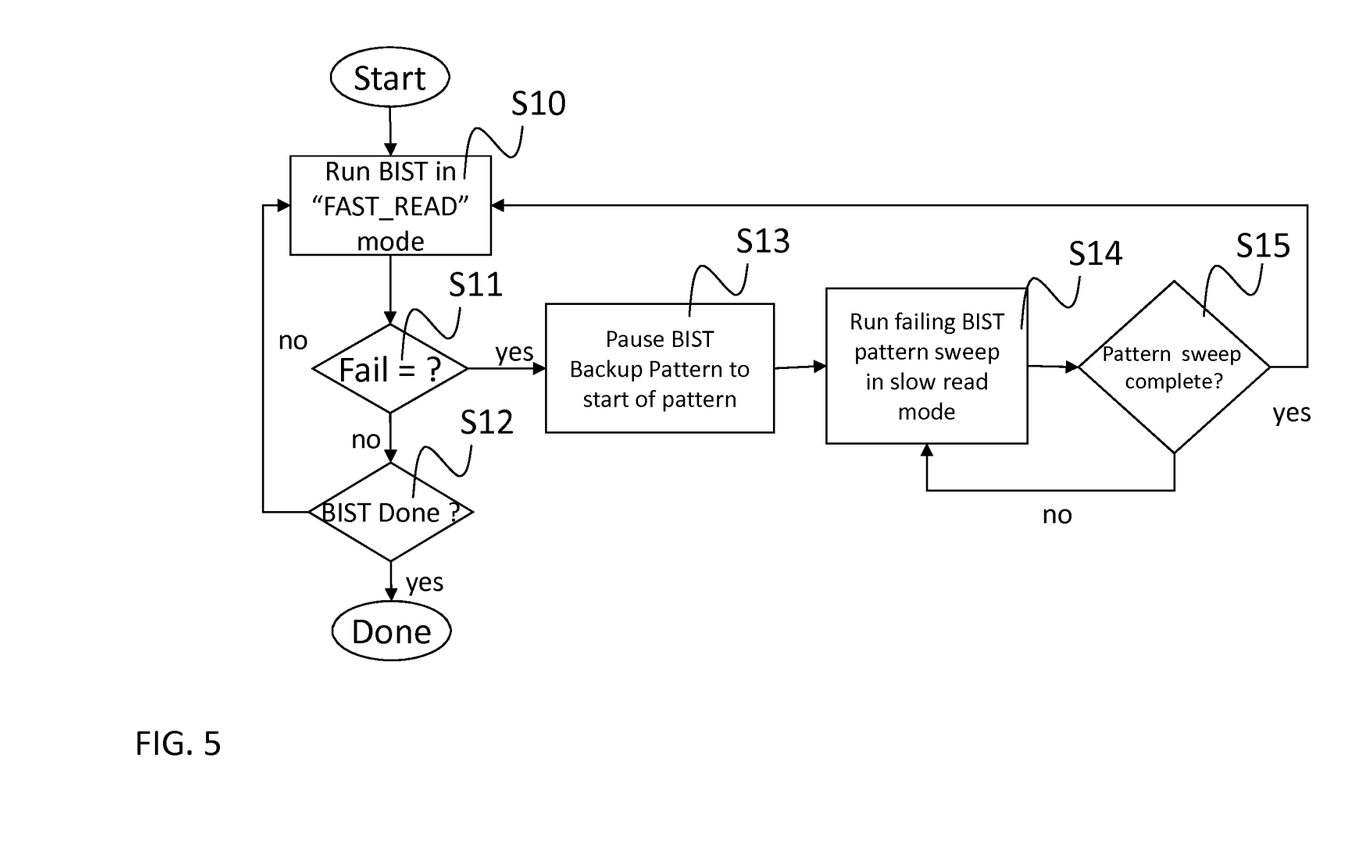
FIG. 5 shows a flow diagram of a method according to embodiments of the invention.

Turning now to FIG. 5, and with continuing reference to FIGS. 1-3, a method according to embodiments of the invention is shown. This method is similar to the method shown in FIG. 4, in that, at S10, the BIST architecture 1 is run in a fast mode. That is, during operation, a BIST engine (not shown) will generate the same address for each instruction in the burst of instructions during a read/write/read/write sweep. The read data from all read instructions of the burst of instructions are compressed into a signature string. The burst of data is compressed using first compression stage 14A, as shown in FIG. 2. The signature string is then compared with the expected signature string (i.e., expected data 33) to determine whether there is a fail in the burst (S11). In this way, the fail is determined for the entire burst of instructions and there is no determination on which read instruction within the burst actually failed. If there is not a no fail in the burst, if the BIST is done (yes at S12), then the test is finished. If there is no fail in the burst, but the BIST is not complete (no at S12), then test will resume in fast mode for the next burst of instructions.

However, in the method shown in FIG. 5, when there is a fail (yes at S11), the BIST is paused, and the BIST engine will back up to the start of the current BIST pattern sweep or pattern sub-set to the beginning (S13). Then, the BIST engine will run the failing BIST pattern sweep (e.g., the entire failing BIST pattern sweep) in slow read mode (S14). Once the failing BIST pattern sweep is complete (yes at S15), the fast read mode BIST will resume for subsequent BIST pattern sweeps.

The compression of the read data, within the burst of instructions, using set of first compression stages 14A and 14B, into a single string, allows for the entire burst of instructions for every burst within a pattern sweep, to be analyzed in a fast read mode. That way, only those failed BIST pattern sweeps are tested in slow read mode by the BIST engine. In most cases, where memories do not fail within the BIST pattern sweep, this will help to reduce the BIST test time.

Figure 6:
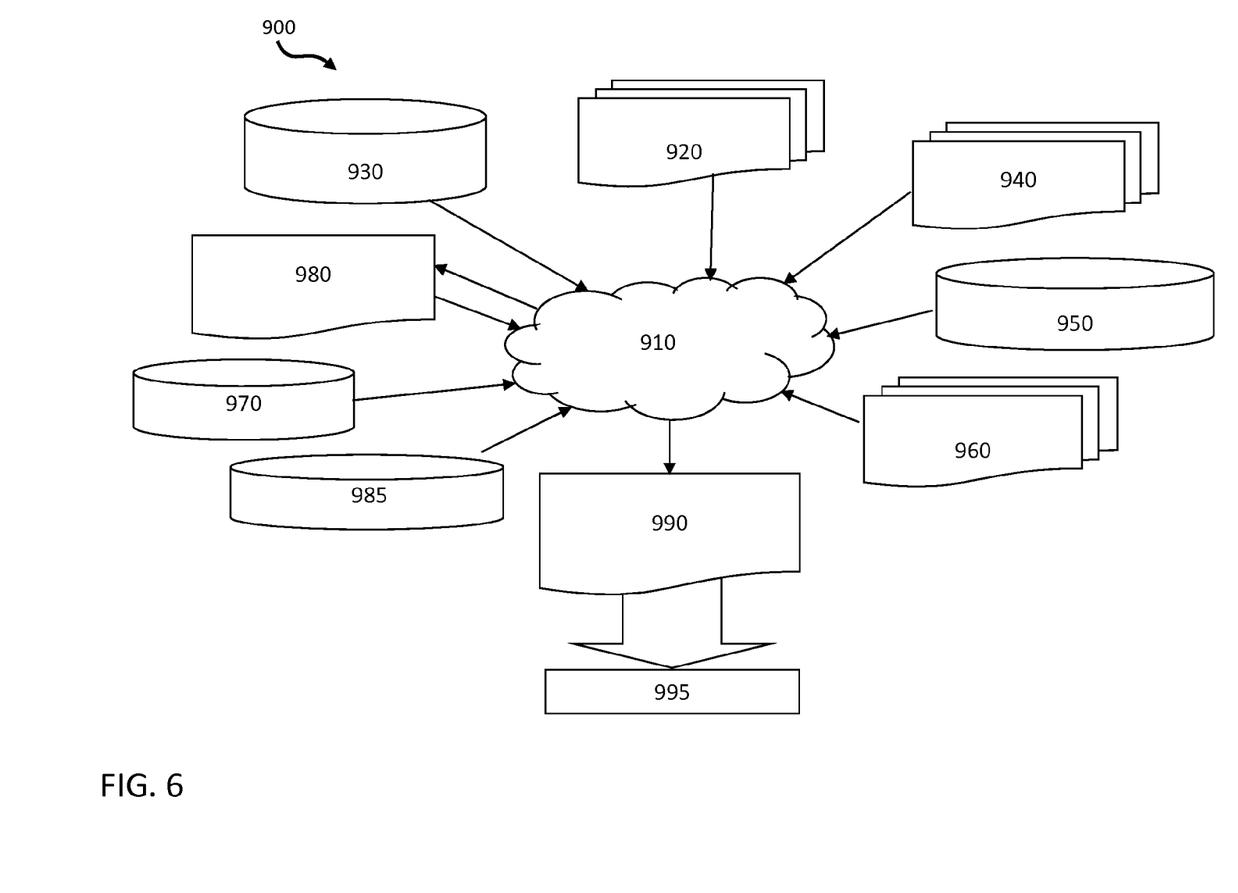
FIG. 6 shows a flow diagram according to embodiments of the invention.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A built-in-self-test (BIST) architecture for reducing BIST test time of a memory for an integrated circuit (IC) chip, the architecture comprising:
 a latch for receiving a burst of data from a memory;
 a first compression stage for receiving the burst of data and for compressing the burst of data into a plurality of AND and OR latches, wherein the first compression stage includes a plurality of AND gates, each AND gate having an output stored in a respective one of the plurality of AND latches, each AND latch having an output, and a plurality of OR gates, each OR gate having an output stored in a respective one of the plurality of OR latches, each OR latch having an output;
 a second compression stage for comparing the compressed bursts of data with expected data; and
 a logic gate for determining whether there is a fail in the burst of data;
 wherein the second compression stage includes:
  a plurality of multiplexors for receiving the outputs of the plurality of AND latches and the outputs of the plurality of OR latches; and
  wherein the expected data is a selection signal for each of the plurality of multiplexors.

2. The BIST architecture of claim 1, wherein each of the plurality of AND gates receives a different portion of the burst of data.

3. The BIST architecture of claim 1, wherein each of the plurality of OR gates receives a different portion of the burst of data.

4. A method of reducing test time for a built-in-self-test (BIST) architecture, the method comprising:
 performing a first read of the BIST, wherein the performing includes:
  receiving a burst of data from a memory at a pair of latches;
  compressing the burst of data in a first compression stage; and
  comparing the compressed burst of data with expected data;
 determining whether there is fail in the burst of data;
 in response to determining a fail in the burst of data, performing a second read of the BIST for the received burst of data;
 wherein compressing the burst of data in the first compression stage includes sending the burst of data to a plurality of AND gates and a plurality of OR gates; and
 sending an output of the plurality of AND gates to a plurality of AND latches.

5. The method of claim 4, further comprising, in response to the fail in the burst of data:
 pausing the first read of the BIST; and
 setting a read address to a previous read address.

6. The method of claim 5, further comprising resuming the first read of the BIST after the second read of the BIST for the failed burst of data.

7. The method of claim 4, further comprising sending an output of the plurality of OR gates to a plurality of OR latches.

8. The method of claim 7, wherein comparing the compressed burst of data with expected data includes sending the outputs of the plurality of AND latches and the outputs of the plurality of OR latches to a plurality of multiplexors.

9. The method of claim 8, wherein the expected data is a selection signal for each of the plurality of multiplexors.

* * * * *